(12) United States Patent
Okuno et al.

(10) Patent No.: US 11,837,270 B2
(45) Date of Patent: Dec. 5, 2023

(54) FERROELECTRIC MEMORY AND MEMORY ELEMENT THEREOF

(71) Applicants: SONY SEMICONDUCTOR SOLUTIONS CORPORATION, Kanagawa (JP); SONY GROUP CORPORATION, Tokyo (JP)

(72) Inventors: Jun Okuno, Kanagawa (JP); Toshiyuki Kobayashi, Tokyo (JP)

(73) Assignees: Sony Semiconductor Solutions Corporation, Kanagawa (JP); Sony Group Corporation, Tokyo (JP)

(*) Notice: Subject to any disclaimer, the term of this patent is extended or adjusted under 35 U.S.C. 154(b) by 157 days.

(21) Appl. No.: 17/436,777

(22) PCT Filed: Feb. 6, 2020

(86) PCT No.: PCT/JP2020/004574
§ 371 (c)(1),
(2) Date: Sep. 7, 2021

(87) PCT Pub. No.: WO2020/195214
PCT Pub. Date: Oct. 1, 2020

(65) Prior Publication Data
US 2022/0189525 A1 Jun. 16, 2022

(30) Foreign Application Priority Data
Mar. 22, 2019 (JP) ................. 2019-054267

(51) Int. Cl.
*G11C 11/22* (2006.01)
*H10B 53/30* (2023.01)

(52) U.S. Cl.
CPC ........ *G11C 11/2275* (2013.01); *G11C 11/221* (2013.01); *G11C 11/2273* (2013.01); *H10B 53/30* (2023.02)

(58) Field of Classification Search
CPC .............. G11C 11/2275; G11C 11/221; G11C 11/2273; G11C 11/2255; G11C 11/2257;
(Continued)

(56) References Cited

U.S. PATENT DOCUMENTS

| 5,216,572 A | 6/1993 | Larson et al. |
| 9,460,770 B1 * | 10/2016 | Nicholes ............. G11C 11/5657 |

(Continued)

FOREIGN PATENT DOCUMENTS

| JP | H06-013572 | 1/1994 |
| JP | H06-224389 | 8/1994 |

(Continued)

OTHER PUBLICATIONS

International Search Report prepared by the Japan Patent Office dated Apr. 13, 2020, for International Application No. PCT/JP2020/004574, 3 pages.

*Primary Examiner* — Khamdan N. Alrobaie
(74) *Attorney, Agent, or Firm* — Sheridan Ross PC

(57) ABSTRACT

A ferroelectric memory is intended to reduce an applied voltage required at the times of writing and reading. A ferroelectric capacitor includes a ferroelectric film and a top electrode and a bottom electrode including materials with different work functions formed above and below the ferroelectric film. The transistor is connected to either the top electrode or the bottom electrode to select the ferroelectric capacitor. A drive control unit applies, at the times of writing and reading, a voltage lower than that at the time of erasing by a predetermined potential difference to the ferroelectric film.

14 Claims, 21 Drawing Sheets

(58) Field of Classification Search
CPC .. G11C 11/2259; G11C 11/2293; H10B 53/30
See application file for complete search history.

(56) References Cited

U.S. PATENT DOCUMENTS

| | | | |
|---|---|---|---|
| 10,038,092 B1* | 7/2018 | Chen | H10B 53/20 |
| 10,192,605 B2* | 1/2019 | Nicholes | H01L 28/65 |
| 2016/0005961 A1 | 1/2016 | Ino | |
| 2017/0062037 A1* | 3/2017 | Nicholes | G11C 11/2273 |
| 2022/0109074 A1* | 4/2022 | Pešic | G06N 3/063 |
| 2022/0278115 A1* | 9/2022 | Wei | H01L 28/60 |

FOREIGN PATENT DOCUMENTS

| | | |
|---|---|---|
| JP | H11-039882 | 2/1999 |
| JP | 2006-032526 | 2/2006 |
| JP | 2015-015334 | 1/2015 |
| JP | 2018-533154 | 11/2018 |

\* cited by examiner

FIG. 2

| MATERIAL | WORK FUNCTION WF (eV) |
|---|---|
| TiN | 4.6 - 4.8 |
| TaN | 4.4 - 5.0 |
| TiSi2 | 4.5 |
| TiAl | 4.1 |
| Al | 4.1 |
| W | 4.5 |
| RuO2 | 5.3 |
| Pt | 5.6 |

WRITE DRIVE

WORD LINE a

PLATE LINE b

BIT LINE c

V FERROELECTRIC d

ERASE DRIVE

WORD LINE a

PLATE LINE b

BIT LINE c

V FERROELECTRIC d

READ DRIVE

WORD LINE a

PLATE LINE b

BIT LINE

NEGATIVE REMANENT POLARIZATION

POSITIVE REMANENT POLARIZATION c

V FERROELECTRIC d

WRITE DRIVE a b c d

ERASE DRIVE

WORD LINE a

PLATE LINE b

BIT LINE c

V FERROELECTRIC d

READ DRIVE

WORD LINE a

PLATE LINE b

BIT LINE c

V FERROELECTRIC d

FIG. 15

WRITE DRIVE

——————————— WORD LINE a

——————————— PLATE LINE b

——————————— BIT LINE c

——————————— V FERROELECTRIC d

ERASE DRIVE

WORD LINE a

PLATE LINE b

BIT LINE c

V FERROELECTRIC d

WRITE DRIVE

WORD LINE a

PLATE LINE b

BIT LINE c

V FERROELECTRIC d

ERASE DRIVE

WORD LINE a

PLATE LINE b

BIT LINE c

V FERROELECTRIC d

FIG. 21

READ DRIVE

WORD LINE a

PLATE LINE b

NEGATIVE REMANENT
POLARIZATION

BIT LINE

POSITIVE REMANENT
POLARIZATION c

POSITIVE REMANENT
POLARIZATION
      NEGATIVE REMANENT
      POLARIZATION

V FERROELECTRIC d

FERROELECTRIC MEMORY AND MEMORY ELEMENT THEREOF

CROSS REFERENCE TO RELATED APPLICATIONS

This application is a national stage application under 35 U.S.C. 371 and claims the benefit of PCT Application No. PCT/JP2020/004574 having an international filing date of 6 Feb. 2020, which designated the United States, which PCT application claimed the benefit of Japanese Patent Application No. 2019-054267 filed 22 Mar. 2019, the entire disclosures of each of which are incorporated herein by reference.

TECHNICAL FIELD

The present technology relates to a ferroelectric memory. More specifically, the present technology relates to a ferroelectric memory that reduces applied voltage required at the times of writing and reading.

BACKGROUND ART

In recent years, a ferroelectric memory has been attracting attention as a nonvolatile memory. The ferroelectric memory defines a value stored using a remanent polarization state in a ferroelectric. Here, as an example, attention is given to a 1T-1C ferroelectric memory that uses, as a memory cell, a ferroelectric capacitor and a MOSFET for memory cell selection. In this case, in a write operation and an erase operation, a voltage is applied to a top electrode and a bottom electrode of the ferroelectric capacitor. On the other hand, in a read operation, a high voltage is applied to the top electrode to detect the amount of change from remanent polarization. A memory device using such ferroelectric memories has been proposed (see, for example, Patent Document 1).

CITATION LIST

Patent Document

Patent Document 1: Japanese Patent Application Laid-Open No. H11-039882

SUMMARY OF THE INVENTION

Problems to be Solved by the Invention

In the above-described conventional technique, a value is stored in the ferroelectric memory using the remanent polarization in the ferroelectric. At this time, in order to obtain sufficient remanent polarization at the time of reading, a high applied voltage is required at the time of writing or reading. This can have adverse effects such as an increase in element size and a decrease in life.

The present technology has been invented in view of such circumstances, and an object thereof is to reduce an applied voltage required at the times of writing and reading in a ferroelectric memory.

Solutions to Problems

The present technology has been made to solve the above-described problems. A first aspect thereof is a ferroelectric memory including a ferroelectric capacitor including a ferroelectric film above and below which a top electrode and a bottom electrode including materials with different work functions are formed, a transistor connected to either the top electrode or the bottom electrode to select the ferroelectric capacitor, and a drive control unit that applies, at the times of writing and reading, a voltage lower than that at the time of erasing by a predetermined potential difference to the ferroelectric film. This has the effect of reducing the voltage applied to the ferroelectric film at the times of writing and reading.

Furthermore, in the first aspect, the predetermined potential difference may a voltage depending on the work functions of the materials of the top electrode and the bottom electrode. This has the effect of driving writing and reading using the potential difference depending on the work functions of the materials of the top electrode and the bottom electrode.

Furthermore, in the first aspect, the predetermined potential difference may be a voltage corresponding to the absolute value of a difference between the work functions of the materials of the top electrode and the bottom electrode. This has the effect of driving writing and reading using the potential difference corresponding to the absolute value of the difference between the work functions of the materials of the top electrode and the bottom electrode.

Furthermore, in the first aspect, the drive control unit may apply, at the time of erasing, a voltage with a longer pulse width than at the time of writing to the ferroelectric film. This has the effect of driving erasing without increasing the voltage.

Furthermore, in the first aspect, the drive control unit may perform, at the time of reading, rewriting by applying a voltage with a pulse width and a voltage value equivalent to those at the time of erasing to the ferroelectric film. This has the effect of rewriting a value destroyed by reading.

Furthermore, in the first aspect, the transistor may be an N-type transistor, and one of the top electrode and the bottom electrode to which a voltage of a higher absolute value is applied at the time of writing or reading may include a material with a lower work function than the other. In this case, a contact may be further included which connects one of the top electrode and the bottom electrode to which the voltage of the higher absolute value is applied at the time of writing or reading and the transistor.

Furthermore, in this case, the bottom electrode may be connected to the transistor via the contact, and include a material with a higher work function than the top electrode. Furthermore, the top electrode may be connected to the transistor via the contact, and include a material with a higher work function than the bottom electrode.

Furthermore, in the first aspect, the transistor may be a P-type transistor, and one of the top electrode and the bottom electrode to which a voltage of a higher absolute value is applied at the time of writing or reading may include a material with a higher work function than the other.

Furthermore, in the first aspect, a sense amplifier may be further included which amplifies a potential of the ferroelectric capacitor selected by the transistor. This has the effect of amplifying the potential with respect to the variation of the potential at the time of reading.

Furthermore, in the first aspect, the ferroelectric film may include a material with an electronegativity of a metal atom of less than 1.7. This has the effect of thinning the ferroelectric film or broadening options for the material of the top electrode. As an example, the ferroelectric film may include a hafnium oxide film.

Furthermore, a second aspect of the present technology is a ferroelectric memory element including a ferroelectric film including a hafnium oxide film, a top electrode and a bottom electrode formed above and below the ferroelectric film, the top electrode and the bottom electrode including materials with different work functions, and a transistor connected to one of the top electrode and the bottom electrode via a contact. This has the effect of thinning the ferroelectric film in the ferroelectric memory element or broadening options for the material of the top electrode.

BRIEF DESCRIPTION OF DRAWINGS

FIG. 2 is a diagram illustrating an example of work functions corresponding to materials that may be used as a top electrode 112 and a bottom electrode 113 according to the first embodiment of the present technology.

FIG. 15 is a diagram illustrating an example of write drive control of the ferroelectric memory according to the fourth embodiment of the present technology.

FIG. 21 is a diagram illustrating an example of read drive control of the ferroelectric memory according to the fifth embodiment of the present technology.

MODE FOR CARRYING OUT THE INVENTION

Hereinafter, a mode for carrying out the present technology (hereinafter referred to as an embodiment) will be described. The description will be made in the following order.

1. First embodiment (example in which voltage-charge curve is shifted in negative voltage direction)
2. Second embodiment (example in which N-type transistor and top electrode are connected)
3. Third embodiment (example in which voltage-charge curve is shifted in positive voltage direction)
4. Fourth embodiment (example in which sense amplifier is connected to plate line)
5. Fifth embodiment (example in which P-type transistor and bottom electrode are connected)

1. First Embodiment

[Element Structure of Ferroelectric Memory]

Figure 1:
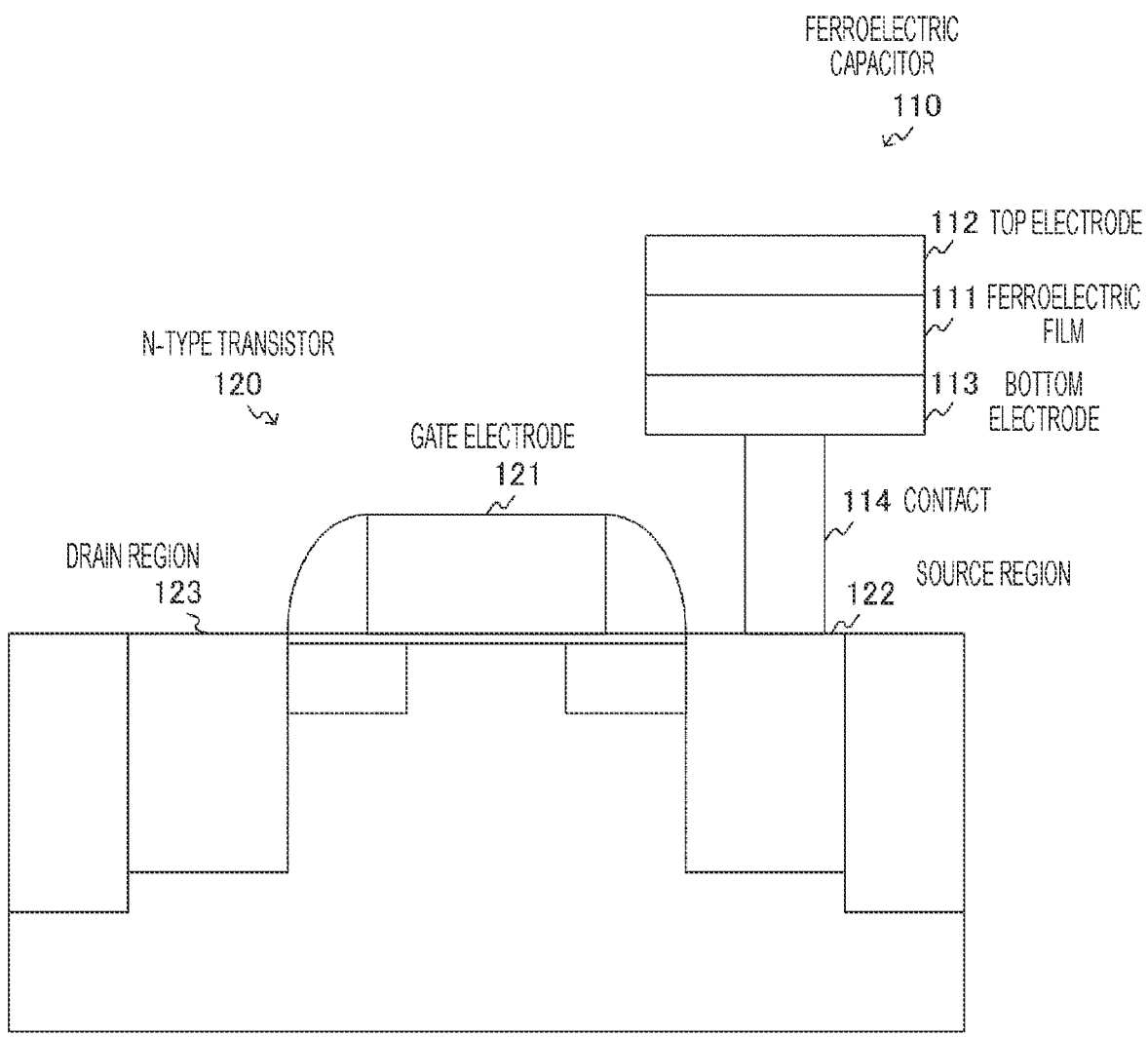
FIG. 1 is a cross-sectional view illustrating an example of an element structure of a ferroelectric memory according to a first embodiment of the present technology.

FIG. 1 is a cross-sectional view illustrating an example of an element structure of a ferroelectric memory according to a first embodiment of the present technology. An element of the ferroelectric memory has a structure in which a ferroelectric capacitor 110 and an N-type transistor 120 are connected via a contact 114.

The ferroelectric capacitor 110 is a storage unit that stores a value using a remanent polarization state in a ferroelectric, and has a structure in which a ferroelectric film 111 is sandwiched by a top electrode 112 and a bottom electrode 113 from above and below. That is, on a semiconductor substrate such as silicon (Si), the ferroelectric capacitor 110 is formed from the bottom layer in the order of the bottom electrode 113, the ferroelectric film 111, and the top electrode 112.

The material of the ferroelectric film 111 includes a hafnium oxide film ($HfO_2$) desirably containing silicon, zirconium (Zr), lanthanum (La), niobium (Nb), yttrium (Y), germanium (Ge), and/or scandium (Sc). These materials have relatively low electronegativity and have, for example, an electronegativity of a metal atom of less than 1.7.

However, those with relatively high electronegativity such as lead zirconate titanate (PZT), strontium bismuth tantalate (SBT), and bismuth lanthanum titanate (BLT) materials can also be used as the material of the ferroelectric film 111.

A hafnium oxide film can be thinned to, for example, about 10 nm. On the other hand, lead zirconate titanate has a thickness of 100 nm or more. Thus, in terms of thinning, it is also desirable to employ a hafnium oxide film as the material of the ferroelectric film 111.

In addition, in terms of a manufacturing process, low electronegativity is also desirable in the following respects. Specifically, in a semiconductor manufacturing line, individual materials are formed in order from the bottom layer. Once a material with high electronegativity is formed, it is usually avoided to form a material with low electronegativity in a layer thereon. In some cases, due to the problem of electronegativity, only a dedicated apparatus can handle it. Therefore, considering the formation of the top electrode 112 on the ferroelectric film 111, using a material with low electronegativity as the material of the ferroelectric film 111 can broaden options for the material of the top electrode 112.

The top electrode 112 and the bottom electrode 113 include materials with different work functions. In this example, they are selected to satisfy $$X1<X2$$

where X1 is the work function of the top electrode 112, and X2 is the work function of the bottom electrode 113. Specific examples of the materials will be described later.

The N-type transistor 120 is an nMOS transistor for selecting the memory element. The N-type transistor 120 includes a gate electrode 121, a source region 122, and a drain region 123. The source region 122 of the N-type transistor 120 and the bottom electrode 113 of the ferroelectric capacitor 110 are connected by the contact 114. Note that the N-type transistor 120 is an example of a transistor described in the claims.

As an example, it is assumed that the contact 114 has a laminated structure with titanium (Ti) and titanium nitride (TiN) as a barrier metal at the hole bottom, and has a structure in which tungsten (W) is embedded as a conductor. However, this structure is an example. Another material may be used as long as it is connected to the N-type transistor 120 with an electrically ohmic material.

[Work Functions]

FIG. 2 is a diagram illustrating an example of work functions corresponding to materials that may be used as the top electrode 112 and the bottom electrode 113 according to the first embodiment of the present technology.

As described above, the top electrode 112 and the bottom electrode 113 include materials with different work functions. Further, it is a necessary condition to select materials satisfying work function X1<work function X2. By selecting the materials of the top electrode 112 and the bottom electrode 113 on the basis of a correspondence table in the figure, this necessary condition can be satisfied. For example, by selecting TiAl as the top electrode 112 and selecting TiN as the bottom electrode 113, the necessary condition can be satisfied.

In this example, it is assumed that each of the top electrode 112 and the bottom electrode 113 is a single-layer film. However, each may have a laminated structure with TiN and TiAl, TiN, TaN, and TiAl, or the like as long as work function X1<work function X2 is satisfied.

Note that the values of the work functions described above are shown as representative examples, and can vary depending on, for example, the doping amount of impurity atoms or a film forming method.

[Voltage-Charge Curve]

Figure 3:
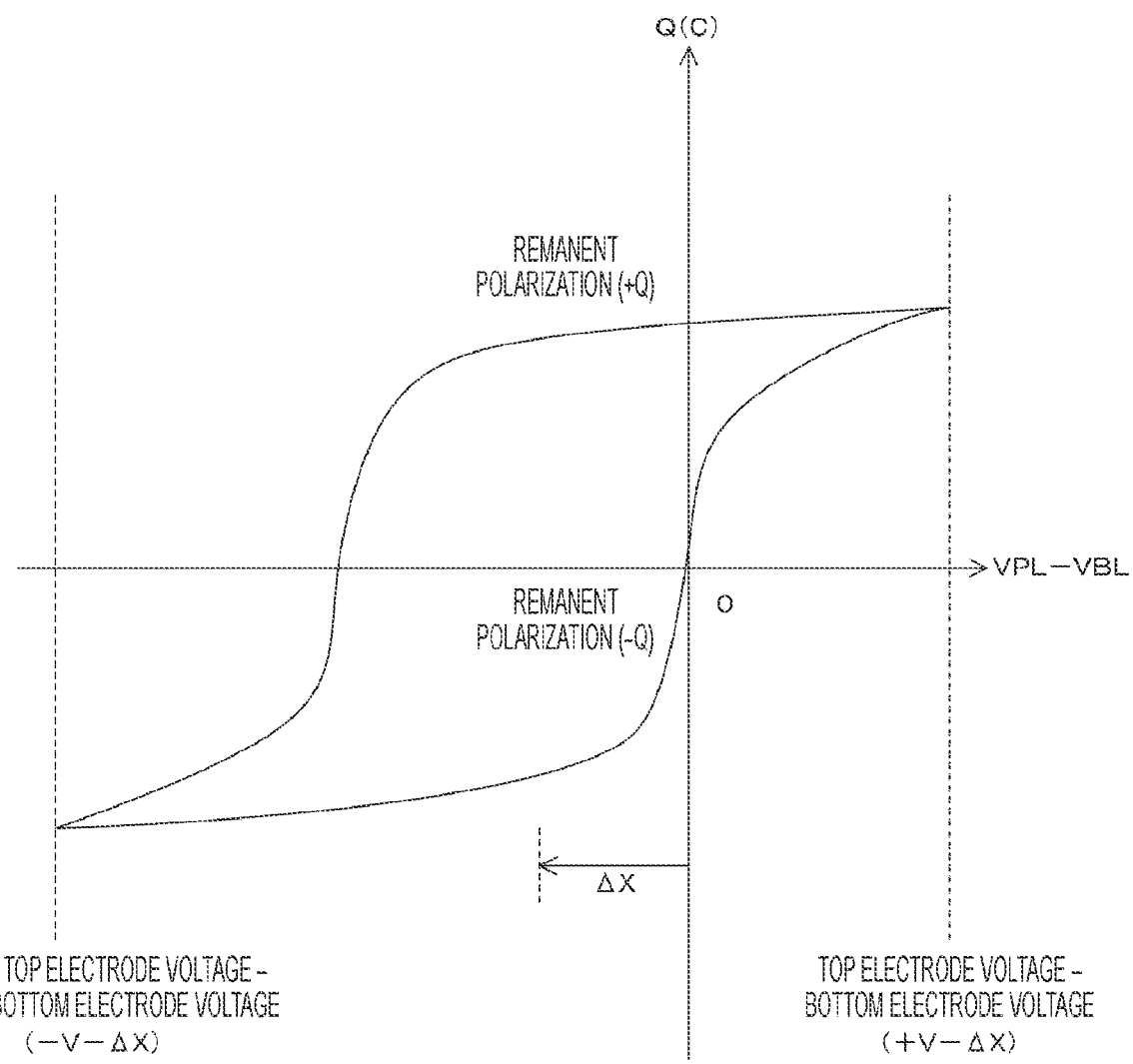
FIG. 3 is a diagram illustrating an example of a voltage-charge curve of the ferroelectric memory according to the first embodiment of the present technology.

FIG. 3 is a diagram illustrating an example of a voltage-charge curve of the ferroelectric memory according to the first embodiment of the present technology.

For the voltage-charge curve of the ferroelectric memory, the vertical axis indicates a charge Q stored in the ferroelectric capacitor 110, and the horizontal axis indicates a voltage V between a plate voltage VPL and a bit voltage VBL. Thus, the slope of this curve (Q/V) indicates the capacitance C of the ferroelectric capacitor 110.

In this embodiment, by making the work function of the top electrode 112 smaller than the work function of the bottom electrode 113, an internal electric field is generated in the ferroelectric film 111. This results in a shift in the negative direction by the work function difference $\Delta X$ (=X2−X1) in the voltage direction, as compared with a normal voltage-charge curve (hysteresis curve). Thus, the maximum voltage of the voltage-charge curve in this embodiment is "+V−$\Delta X$", and the voltage decreases by $\Delta X$. On the other hand, the minimum voltage is "−V−$\Delta X$", and the voltage also decreases by $\Delta X$.

That is, in this embodiment, the maximum voltage of the voltage of the top electrode 112 with respect to that of the bottom electrode 113 is reduced by shifting the voltage-charge curve in the negative direction by $\Delta X$ in the voltage direction.

[Equivalent Circuit of Ferroelectric Memory]

Figure 4:
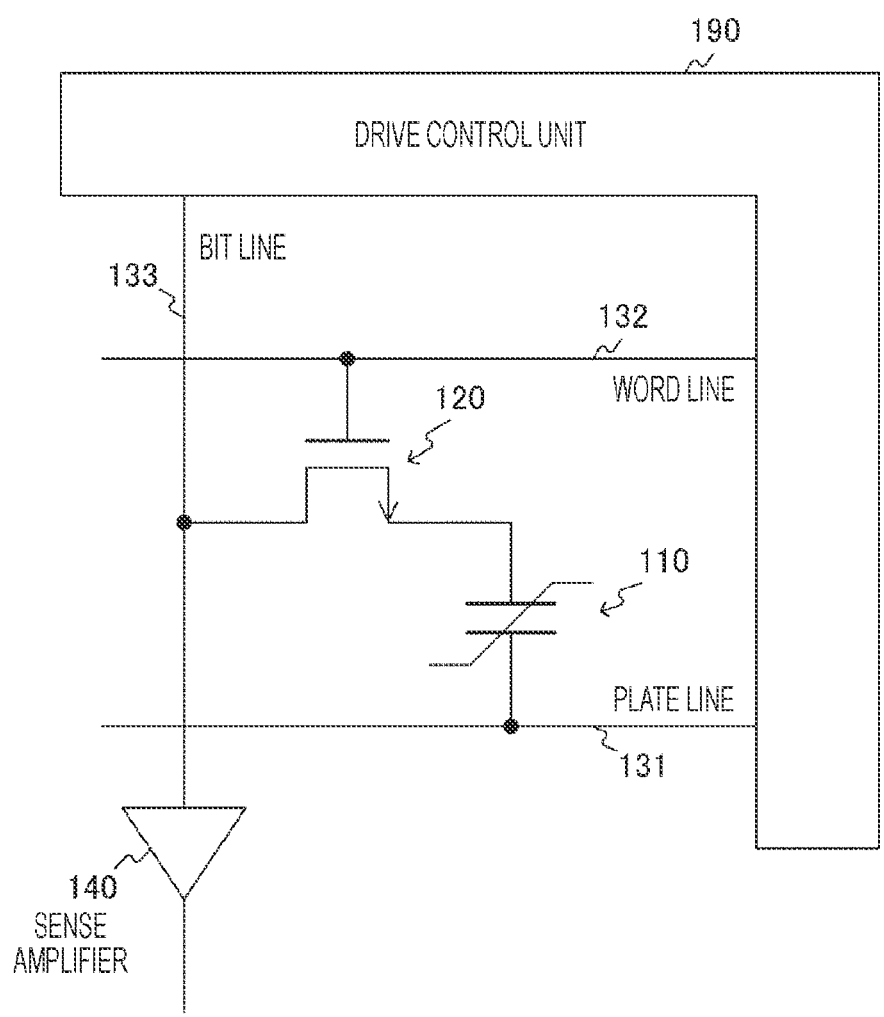
FIG. 4 is a diagram illustrating an example of an equivalent circuit of the ferroelectric memory according to the first embodiment of the present technology.

FIG. 4 is a diagram illustrating an example of an equivalent circuit of the ferroelectric memory according to the first embodiment of the present technology.

This ferroelectric memory has a memory array structure with memory elements each including the ferroelectric capacitor 110 and the N-type transistor 120. A plate line 131, a word line 132, and a bit line 133 are wired from a drive control unit 190 to each memory element. Furthermore, as described above, the source region 122 of the N-type transistor 120 and the bottom electrode 113 of the ferroelectric capacitor 110 are connected by the contact 114.

The word line 132 is connected to the gate electrode 121 of the N-type transistor 120. The bit line 133 is connected to the drain region 123 of the N-type transistor 120. Further, the plate line 131 is connected to the top electrode 112.

Furthermore, a sense amplifier 140 is connected to the output of the bit line 133 so that the sense amplifier 140 amplifies the potential of the bit line 133 to absorb voltage variation at the time of reading.

[Drive Control of Ferroelectric Memory]

Figure 5:
FIG. 5 is a diagram illustrating an example of write drive control of the ferroelectric memory according to the first embodiment of the present technology.
Figure 5:
Figure 5:
Figure 5:

FIG. 5 is a diagram illustrating an example of write drive control of the ferroelectric memory according to the first embodiment of the present technology.

First, the word line 132 of a bit to be selected is put into a high (H) state. Consequently, the N-type transistor 120 is turned on, and the voltage of the bit line 133 is applied to the bottom electrode 113.

Next, the plate line 131 is put into an H state, and the bit line 133 is put into a low (L) state. At this time, a voltage is applied to the ferroelectric capacitor 110 such that the voltage Vprg between the plate line 131 and the bit line 133 becomes "+V−$\Delta X$" (V ferroelectric). Furthermore, the pulse width at that time is set to T1.

Consequently, the maximum voltage (+V−$\Delta X$) is applied to the ferroelectric capacitor 110, allowing instantaneous writing. That is, the voltage required for writing can be made lower by $\Delta X$ than the voltage V it used to be. This is because the voltage-charge curve is shifted in the negative direction by $\Delta X$ in the voltage direction.

Figure 6:
FIG. 6 is a diagram illustrating an example of erase drive control of the ferroelectric memory according to the first embodiment of the present technology.
Figure 6:
Figure 6:
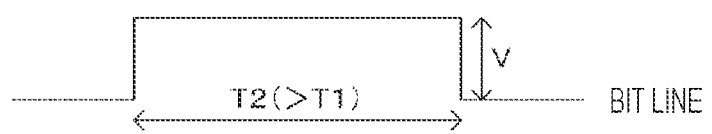
Figure 6:
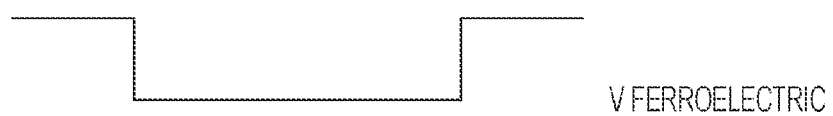

FIG. 6 is a diagram illustrating an example of erase drive control of the ferroelectric memory according to the first embodiment of the present technology.

First, the word line 132 of a bit to be selected is put into the H state. Consequently, the N-type transistor 120 is turned on, and the voltage of the bit line 133 is applied to the bottom electrode 113.

Next, the plate line 131 is put into an L state, and the bit line 133 is put into an H state. At that time, a voltage is applied such that the absolute value of the voltage Vers between the plate line 131 and the bit line 133 becomes about the voltage V as before.

In addition, for a pulse width T2, a pulse is applied for a period satisfying T2>T1 so as to be a longer pulse than that at the time of writing described above. In this case, only a voltage smaller than the absolute value "V+ΔX" of the minimum voltage is applied to the ferroelectric film 111. However, the applied pulse width is long, thus allowing erasing.

That is, due to the shifting of the voltage-charge curve in the negative direction by ΔX in the voltage direction, the absolute value of the maximum voltage normally required for erasing seems to increase. However, instead of increasing the voltage, the pulse width is increased. This can reduce the voltage required for writing without increasing the voltage at the time of erasing.

Note that in this embodiment, an example of increasing the pulse width has been described, but, for example, a method of increasing the number of pulses or the like may be used.

Figure 7:
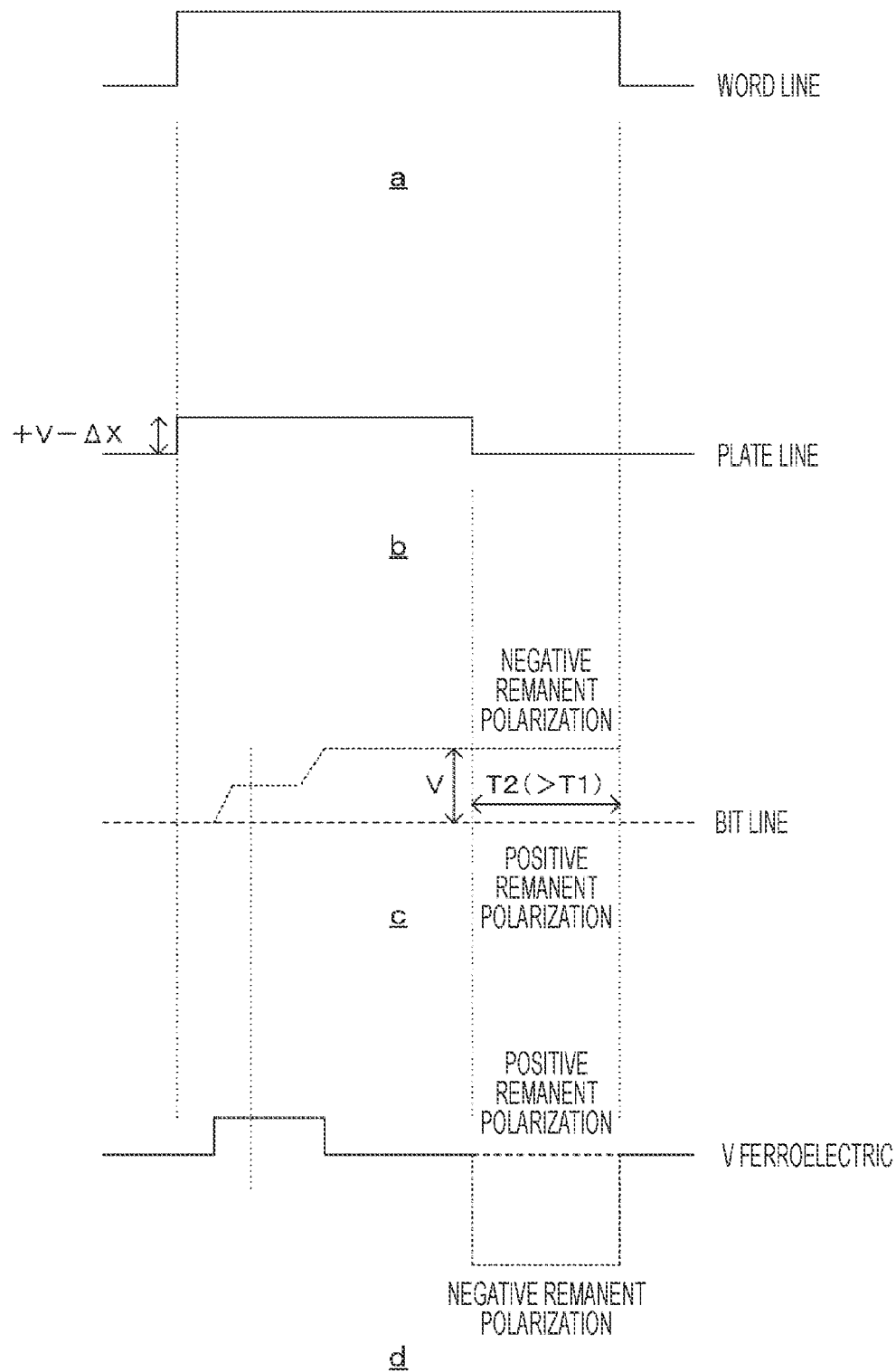
FIG. 7 is a diagram illustrating an example of read drive control of the ferroelectric memory according to the first embodiment of the present technology.

FIG. 7 is a diagram illustrating an example of read drive control of the ferroelectric memory according to the first embodiment of the present technology.

First, precharging is performed such that the voltage of the bit line 133 becomes 0 V. Thereafter, as at the time of writing, a voltage is applied such that the voltage Vprg between the plate line 131 and the bit line 133 becomes "+V−ΔX".

Here, in a case where the state of the ferroelectric is the negative remanent polarization, a voltage higher than the maximum voltage (+V−ΔX) is applied, so that the original state is destroyed, and a large current flows, changing the potential of the bit line 133. Furthermore, for the amount of variation of the potential, the sense amplifier 140 is turned on to amplify the potential of the bit line 133. The amplified voltage is set to be larger than the voltage V and the pulse width T2 as in the above-described erase drive control. Consequently, it is erased again and returns to the original state having the negative remanent polarization.

On the other hand, in a case where the state of the ferroelectric is the positive remanent polarization, a potential change does not occur.

Figure 8:
FIG. 8 is a diagram illustrating another example of read drive control of the ferroelectric memory according to the first embodiment of the present technology.
Figure 8:
Figure 8:
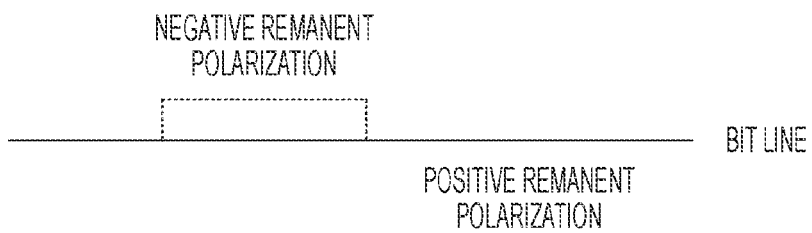
Figure 8:

FIG. 8 is a diagram illustrating another example of read drive control of the ferroelectric memory according to the first embodiment of the present technology.

In the above-described example, it is assumed that re-erasing is performed at the time of reading in a case where the remanent polarization is negative. However, re-erasing may not be performed as illustrated in this example. In this example, in a case where restoration to the original state is required, the original state can be restored by performing the above-described erase drive control at another timing after reading.

As described above, in the first embodiment of the present technology, by selecting the materials of the top electrode 112 and the bottom electrode 113 such that their work functions are different from each other, the voltage-charge curve is shifted in the negative voltage direction. This allows a reduction in voltage between the top electrode 112 and the bottom electrode 113 required at the times of writing and reading.

Further, since the reduction in voltage at the times of writing and reading is possible, the reliability as a memory can be improved. Furthermore, the reduction in voltage at the times of writing and reading allows a reduction in power consumption at the times of writing and reading. Moreover, the reduction in voltage at the times of writing and reading allows a reduction in the size of a transistor in a peripheral circuit required at the times of writing and reading.

2. Second Embodiment

[Element Structure of Ferroelectric Memory]

Figure 9:
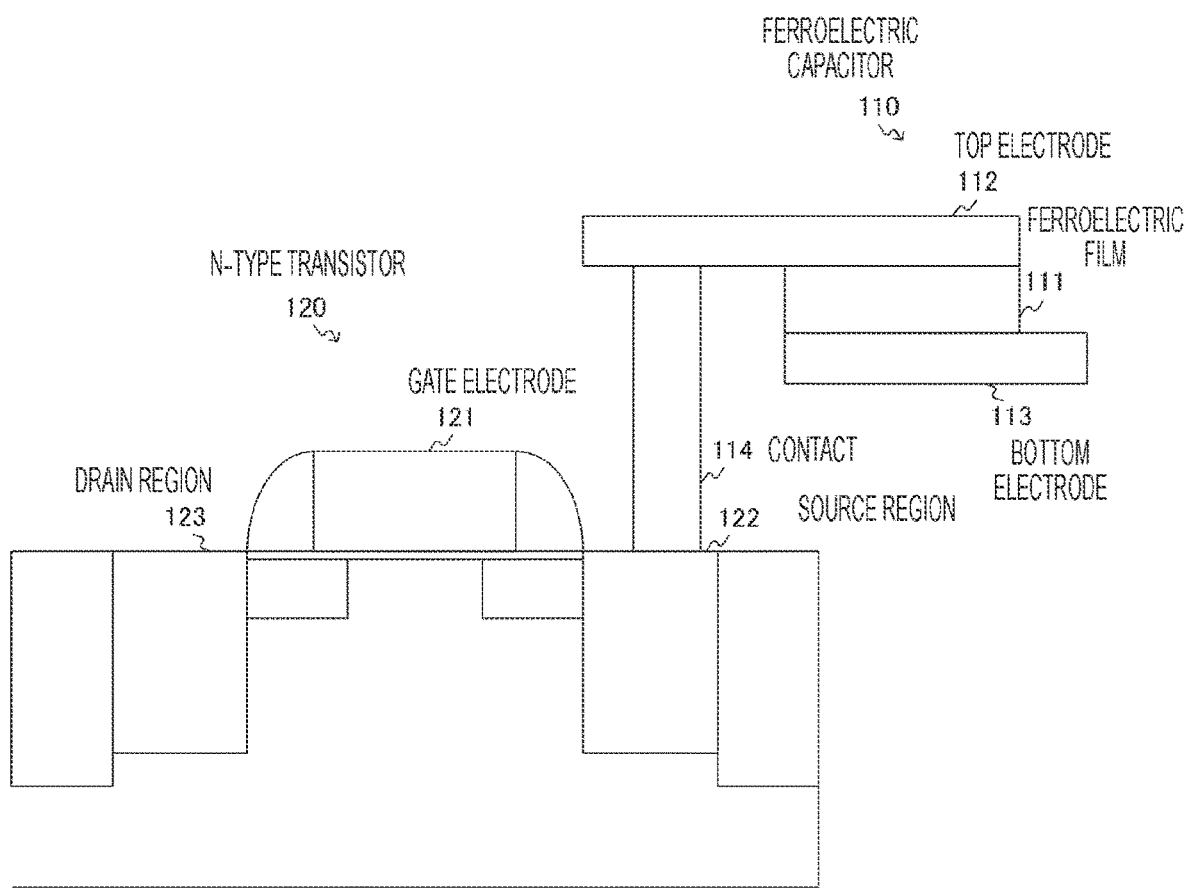
FIG. 9 is a cross-sectional view illustrating an example of an element structure of a ferroelectric memory according to a second embodiment of the present technology.

FIG. 9 is a cross-sectional view illustrating an example of an element structure of a ferroelectric memory according to a second embodiment of the present technology.

In the first embodiment described above, the N-type transistor 120 and the bottom electrode 113 of the ferroelectric capacitor 110 are connected. In the second embodiment, the source region 122 of the N-type transistor 120 and the top electrode 112 of the ferroelectric capacitor 110 are connected. Except for this, the structure is similar to that of the first embodiment described above.

In the structure of the second embodiment, the polarity of a voltage applied between the top electrode 112 and the bottom electrode 113 is opposite to that in the first embodiment described above. Therefore, selection is made such that the relationship between the work function X1 of the top electrode 112 and the work function X2 of the bottom electrode 113 is

X1>X2.

As described above, in the semiconductor manufacturing line, individual materials are formed in order from the bottom layer. Therefore, in terms of the above-described electronegativity, there is a possibility that options for the material of the top electrode 112 are limited. In such a case, the magnitude relationship between the work functions as a necessary condition can be reversed by changing connection with the N-type transistor 120 via the contact 114 according to the work functions of the materials of the top electrode 112 and the bottom electrode 113.

Thus, according to the second embodiment of the present technology, by connecting the N-type transistor 120 and the top electrode 112 of the ferroelectric capacitor 110, the necessary condition for the work functions of the materials of the top electrode 112 and the bottom electrode 113 can be flexibly satisfied.

3. Third Embodiment

In the first and second embodiments described above, examples in which the voltage-charge curve is shifted in the negative direction have been described. The voltage-charge curve may be shifted in the positive direction as described below. In this case, selection is made such that the relationship between the work function X1 of the top electrode 112 and the work function X2 of the bottom electrode 113 is

X1>X2.

[Voltage-Charge Curve]

Figure 10:
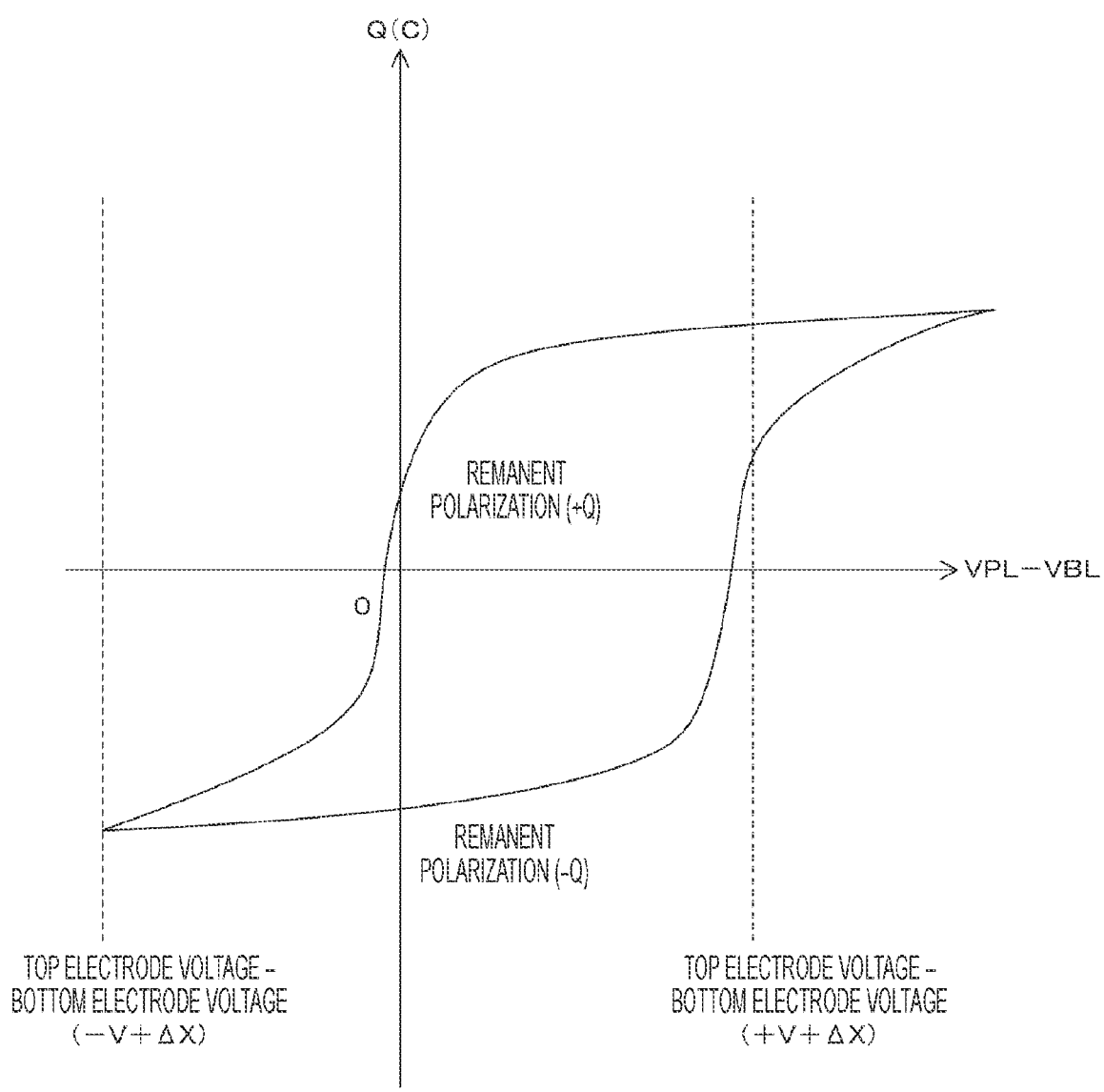
FIG. 10 is a diagram illustrating an example of a voltage-charge curve of a ferroelectric memory according to a third embodiment of the present technology.

FIG. 10 is a diagram illustrating an example of a voltage-charge curve of a ferroelectric memory according to a third embodiment of the present technology.

In the third embodiment, by making the work function of the top electrode 112 larger than the work function of the bottom electrode 113, the voltage-charge curve is shifted in the positive direction by the work function difference ΔX (=X1−X2) in the voltage direction as compared with a normal one. Consequently, the maximum voltage of the voltage-charge curve in this embodiment is "+V+ΔX", and the voltage increases by ΔX. On the other hand, the minimum voltage is "−V+ΔX", and the voltage also increases by ΔX.

[Drive Control of Ferroelectric Memory]

Figure 11:
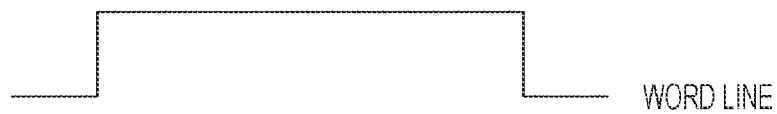
FIG. 11 is a diagram illustrating an example of write drive control of the ferroelectric memory according to the third embodiment of the present technology.
Figure 11:
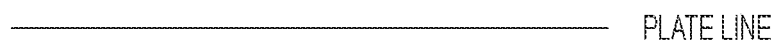
Figure 11:
Figure 11:

FIG. 11 is a diagram illustrating an example of write drive control of the ferroelectric memory according to the third embodiment of the present technology.

First, the word line 132 of a bit to be selected is put into an H state. Consequently, the N-type transistor 120 is turned on, and the voltage of the bit line 133 is applied to the bottom electrode 113.

Next, the plate line 131 is put into an L state, and the bit line 133 is put into an H state. At this time, a voltage is applied such that the voltage Vprg between the plate line 131 and the bit line 133 becomes "$-V+\Delta X$". Thus, the minimum voltage ($-V+\Delta X$) shown in the voltage-charge curve is applied to the ferroelectric film 111, thus allowing writing. That is, the voltage Vprg can be reduced by $\Delta X$ from the voltage V it used to be. This is because the voltage-charge curve is shifted in the positive direction by $\Delta X$ in the voltage direction.

Figure 12:
FIG. 12 is a diagram illustrating an example of erase drive control of the ferroelectric memory according to the third embodiment of the present technology.
Figure 12:
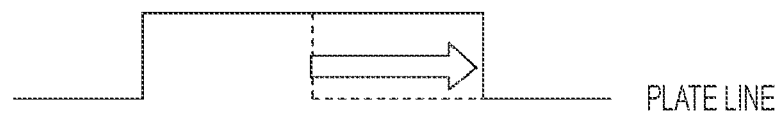
Figure 12:
Figure 12:
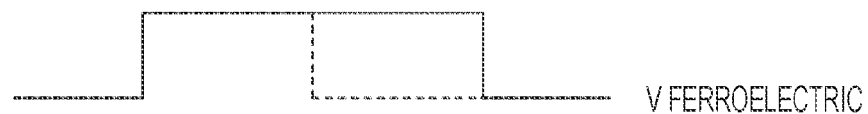

FIG. 12 is a diagram illustrating an example of erase drive control of the ferroelectric memory according to the third embodiment of the present technology.

First, the word line 132 of a bit to be selected is put into an H state. Consequently, the N-type transistor 120 is turned on, and the voltage of the bit line 133 is applied to the bottom electrode 113.

Next, the bit line 133 is put into an L state, and the plate line 131 is put into an H state. At this time, a voltage is applied such that the absolute value of the voltage Vers between the plate line 131 and the bit line 133 becomes a voltage smaller than "$V+\Delta X$". Further, a pulse is applied such that the pulse width becomes longer than that in the write drive control.

This setting allows erasing with a voltage smaller than the absolute value "$V+\Delta X$" of the voltage shown in the voltage-charge curve.

Note that in this embodiment, an example of increasing the pulse width has been described, but, for example, a method of increasing the number of pulses or the like may be used.

Figure 13:
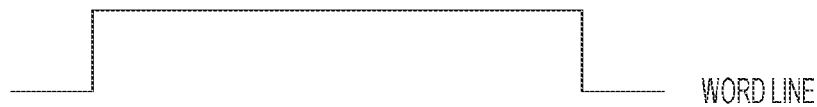
FIG. 13 is a diagram illustrating an example of read drive control of the ferroelectric memory according to the third embodiment of the present technology.
Figure 13:
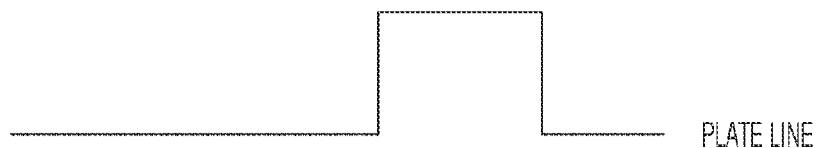
Figure 13:
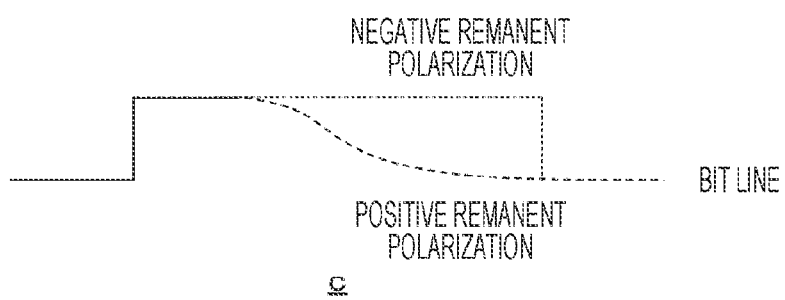
Figure 13:
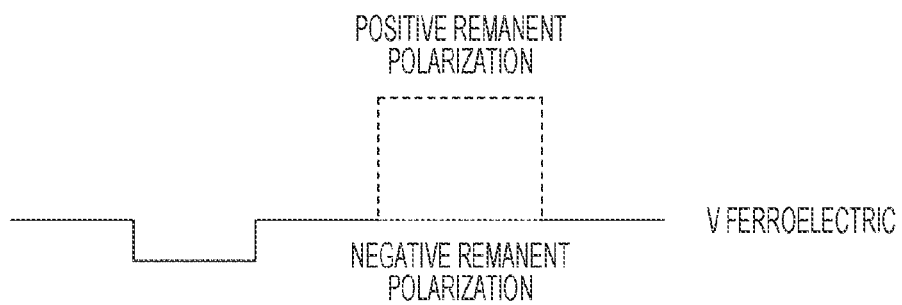

FIG. 13 is a diagram illustrating an example of read drive control of the ferroelectric memory according to the third embodiment of the present technology.

First, precharging is performed such that the voltage of the bit line 133 becomes "$+V-\Delta X$". The potential of the plate line 131 at that time is 0 V.

Here, in a case where the state of the ferroelectric is the positive remanent polarization, a voltage higher than the maximum voltage ($+V+\Delta X$) in the above-described voltage-charge curve is applied, so that the original state is destroyed, and a large current flows, changing the potential of the bit line 133. Further, for the amount of variation of the potential, the sense amplifier 140 is turned on to amplify the potential of the bit line 133 to reduce the potential to about 0 V. In addition, at this timing, a potential of about +V is applied to the plate voltage with a pulse width similar to that at the time of erasing. Consequently, a potential similar to that at the time of erasing is applied to the ferroelectric film 111, so that the positive remanent polarization can be obtained again.

On the other hand, in a case where the state of the ferroelectric is the negative remanent polarization, a potential change does not occur, and thus the negative remanent polarization is maintained after a series of drives.

Note that in the third embodiment, in a case where the remanent polarization is positive, re-erasing is performed at the time of reading. At that time, however, the potential of the plate line 131 may not be increased. In a case where restoration to the original state is required, the original state can be restored by performing the above-described erase drive control at another timing after reading.

As described above, according to the third embodiment of the present technology, in a case where the voltage-charge curve is shifted in the positive voltage direction, the voltage between the top electrode 112 and the bottom electrode 113 required at the times of writing and reading can also be reduced.

4. Fourth Embodiment

[Equivalent Circuit of Ferroelectric Memory]

Figure 14:
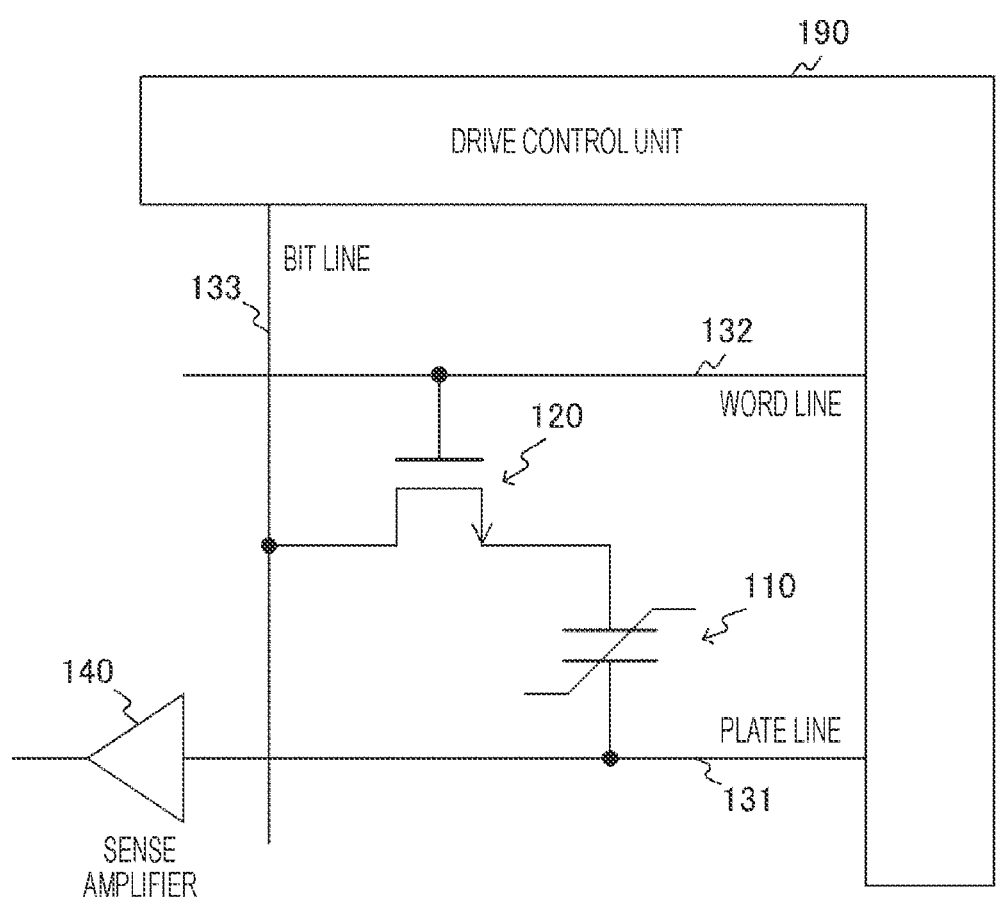
FIG. 14 is a diagram illustrating an example of an equivalent circuit of a ferroelectric memory according to a fourth embodiment of the present technology.

FIG. 14 is a diagram illustrating an example of an equivalent circuit of a ferroelectric memory according to a fourth embodiment of the present technology.

In the above-described third embodiment, the sense amplifier 140 is connected to the bit line 133. In the fourth embodiment, the sense amplifier 140 is connected to the plate line 131. The other connections are similar to those in the case of the third embodiment described above. By connecting the sense amplifier 140 to the plate line 131, the sense amplifier 140 performs amplification on potential variation in the plate line 131 at the time of reading.

[Drive Control of Ferroelectric Memory]

FIG. 15 is a diagram illustrating an example of write drive control of the ferroelectric memory according to the fourth embodiment of the present technology.

First, the word line 132 of a bit to be selected is put into an H state. Consequently, the N-type transistor 120 is turned on, and the voltage of the bit line 133 is applied to the bottom electrode 113.

Next, the plate line 131 is put into an L state. At that time, a voltage is applied to the bit line 133 such that the voltage Vprg between the plate line 131 and the bit line 133 becomes "$-V+\Delta X$". Thus, as in the third embodiment, the minimum voltage ($-V+\Delta X$) in the voltage-charge curve is applied to the ferroelectric film 111, thus allowing writing. That is, the voltage Vprg required for writing can be made lower by $\Delta X$ than the voltage V it used to be. This is because the voltage-charge curve is shifted in the positive direction by $\Delta X$ in the voltage direction as in the third embodiment.

Figure 16:
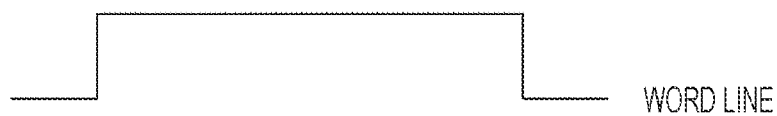
FIG. 16 is a diagram illustrating an example of erase drive control of the ferroelectric memory according to the fourth embodiment of the present technology.
Figure 16:
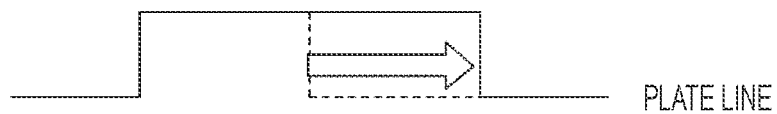
Figure 16:
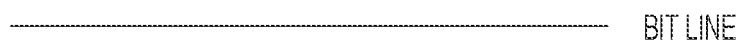
Figure 16:
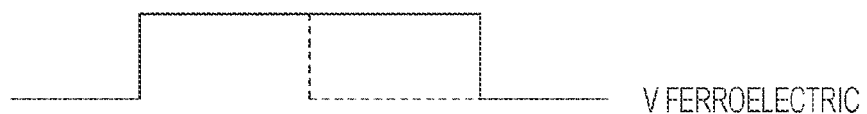

FIG. 16 is a diagram illustrating an example of erase drive control of the ferroelectric memory according to the fourth embodiment of the present technology.

First, the word line 132 of a bit to be selected is put into an H state. Consequently, the N-type transistor 120 is turned on, and the voltage of the bit line 133 is applied to the bottom electrode 113.

Next, the bit line 133 is put into an L state, and the plate line 131 is put into an H state. At that time, for the absolute value of the voltage Vers between the plate line and the bit line, about the normal voltage V is applied. Furthermore, as the pulse width, a pulse longer than that in the write drive control is applied.

This setting allows erasing with a voltage smaller than the absolute value of the voltage "$V+\Delta X$" shown in the voltage-charge curve, as in the third embodiment.

Note that in this embodiment, an example of increasing the pulse width has been described, but, for example, a method of increasing the number of pulses or the like may be used.

Figure 17:
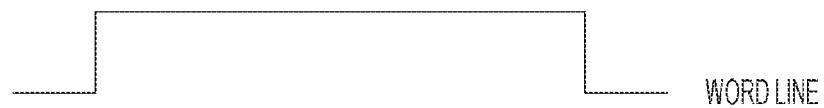
FIG. 17 is a diagram illustrating an example of read drive control of the ferroelectric memory according to the fourth embodiment of the present technology.
Figure 17:
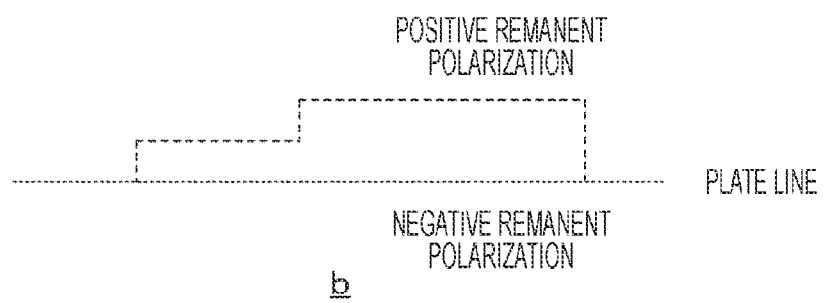
Figure 17:
Figure 17:
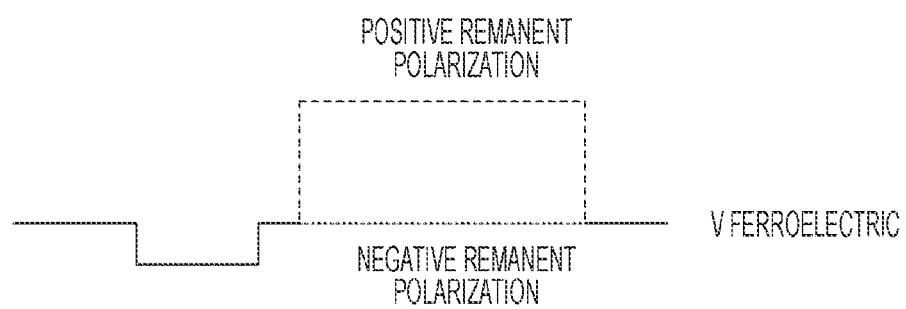

FIG. 17 is a diagram illustrating an example of read drive control of the ferroelectric memory according to the fourth embodiment of the present technology.

First, precharging is performed such that the voltage of the plate line 131 becomes 0 V. Thereafter, as at the time of writing, a voltage is applied such that the voltage Vprg between the plate line 131 and the bit line 133 becomes "$+V-\Delta X$".

Here, in a case where the state of the ferroelectric is the positive remanent polarization, a voltage higher than the maximum voltage in the voltage-charge curve is applied, the original state is destroyed, and a large current flows, thus changing the potential of the plate line 131. Further, for the amount of variation of the potential, the sense amplifier 140 is turned on to amplify the potential of the plate line 131. For the amplified voltage, by setting a voltage similar to that in the erase operation to be longer than the pulse width in the erase operation, re-erasing is performed, and the original state of having the negative remanent polarization is restored.

On the other hand, in a case where the state of the ferroelectric is the negative remanent polarization, a potential change does not occur.

Note that in the above-described example, it is assumed that re-erasing is performed at the time of reading in a case where the remanent polarization is positive. However, re-erasing may not be performed at the time of reading. In a case where restoration to the original state is required, the original state can be restored by performing the above-described erase drive control at another timing after reading.

As described above, according to the fourth embodiment of the present technology, in the configuration where the sense amplifier 140 is connected to the plate line 131 in the third embodiment, the voltage between the top electrode 112 and the bottom electrode 113 required at the times of writing and reading can also be reduced.

5. Fifth Embodiment

[Equivalent Circuit of Ferroelectric Memory]

Figure 18:
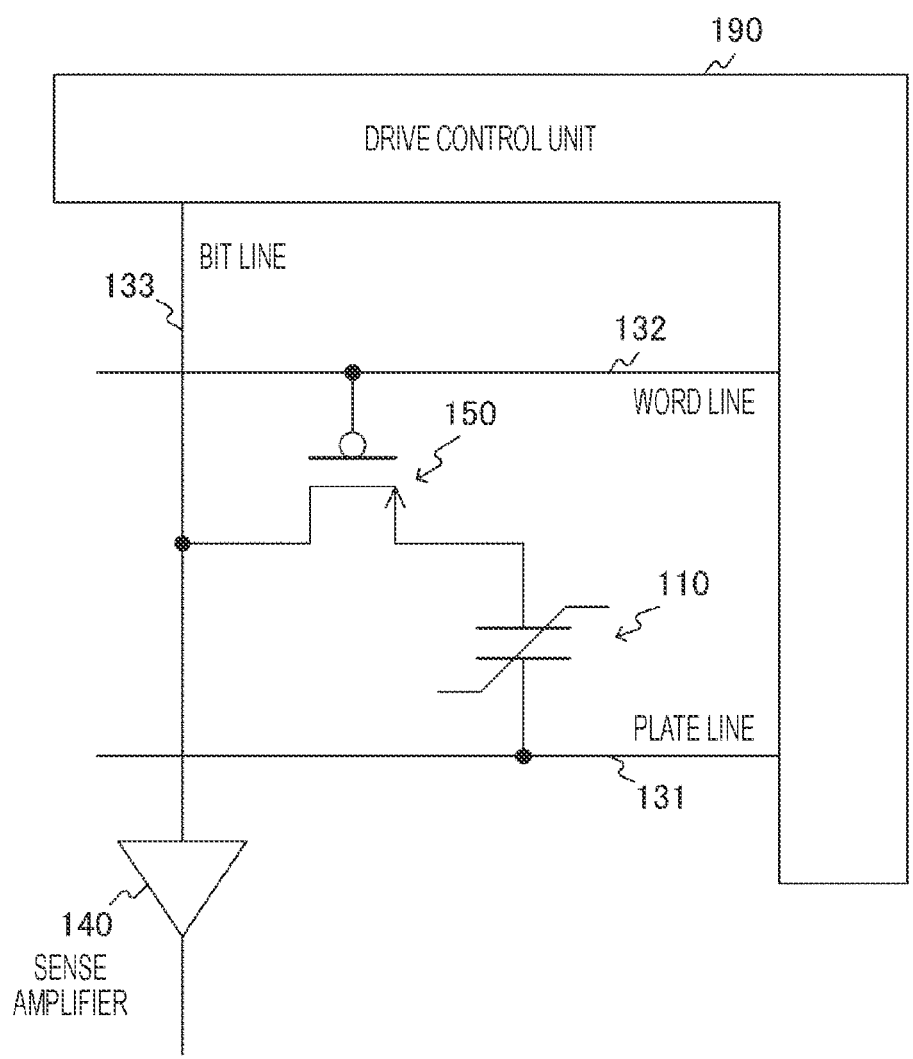
FIG. 18 is a diagram illustrating an example of an equivalent circuit of a ferroelectric memory according to a fifth embodiment of the present technology.

FIG. 18 is a diagram illustrating an example of an equivalent circuit of a ferroelectric memory according to a fifth embodiment of the present technology.

In the above-described third embodiment, the N-type transistor 120 is used as a transistor for memory cell selection. In the fifth embodiment, a P-type transistor 150 is used. Except for this, the configuration is similar to that of the third embodiment described above. In a case where the P-type transistor 150 is used, the effects in the case of the above-described third embodiment can also be obtained by performing drive control as described hereafter. Note that the P-type transistor 150 is an example of the transistor described in the claims.

[Drive Control of Ferroelectric Memory]

Figure 19:
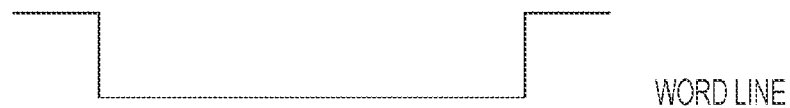
FIG. 19 is a diagram illustrating an example of write drive control of the ferroelectric memory according to the fifth embodiment of the present technology.
Figure 19:
Figure 19:
Figure 19:
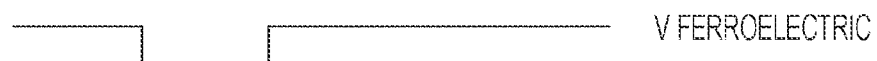

FIG. 19 is a diagram illustrating an example of write drive control of the ferroelectric memory according to the fifth embodiment of the present technology.

First, the word line 132 of a bit to be selected is put into an L state. Consequently, the P-type transistor 150 is turned on, and the voltage of the bit line 133 is applied to the bottom electrode 113.

Next, the bit line 133 is put into an H state, and the plate line 131 is put into an L state. At that time, a voltage is applied such that the voltage Vprg between the plate line and the bit line becomes "−V+ΔX". Thus, as in the third embodiment, the maximum voltage in the voltage-charge curve is applied to the ferroelectric film 111, thus allowing writing. That is, the voltage Vprg can be reduced by ΔX from the voltage V it used to be. This is because the voltage-charge curve is shifted in the positive direction by ΔX in the voltage direction as in the third embodiment.

Figure 20:
FIG. 20 is a diagram illustrating an example of erase drive control of the ferroelectric memory according to the fifth embodiment of the present technology.
Figure 20:
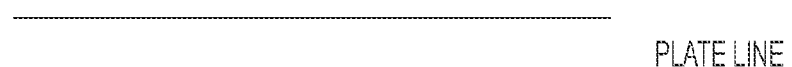
Figure 20:
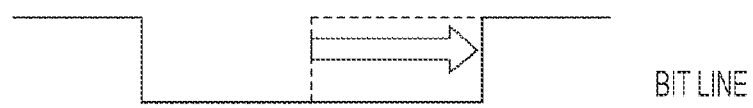
Figure 20:

FIG. 20 is a diagram illustrating an example of erase drive control of the ferroelectric memory according to the fifth embodiment of the present technology.

First, the word line 132 of a bit to be selected is put into the L state. Consequently, the P-type transistor 150 is turned on, and the voltage of the bit line 133 is applied to the bottom electrode 113.

Next, the bit line 133 is put into an L state, and the plate line 131 is put into an H state. At that time, for the absolute value of the voltage Vers between the plate line 131 and the bit line 133, about the normal voltage V is applied. Furthermore, as the pulse width, a pulse longer than that in the write drive control is applied.

This setting allows erasing with a voltage smaller than the absolute value "V+ΔX" of the minimum voltage shown in the voltage-charge curve, as in the third embodiment.

Note that in this embodiment, an example of increasing the pulse width has been described, but, for example, a method of increasing the number of pulses or the like may be used.

FIG. 21 is a diagram illustrating an example of read drive control of the ferroelectric memory according to the fifth embodiment of the present technology.

First, precharging is performed such that the voltage of the plate line 131 becomes Vd. Thereafter, as at the time of writing, a voltage is applied such that the voltage Vprg between the plate line 131 and the bit line 133 becomes "+V−ΔX".

Here, in a case where the state of the ferroelectric is the positive remanent polarization, a voltage higher than the maximum voltage in the voltage-charge curve is applied, the original state is destroyed, and a large current flows, thus changing the potential of the bit line 133. Further, for the amount of variation of the potential, the sense amplifier 140 is turned on to amplify the potential of the bit line 133. By setting a voltage similar to that in the erase operation to be longer than the pulse width in the erase operation, re-erasing is performed, and the original state of having the positive remanent polarization is restored.

On the other hand, in a case where the state of the ferroelectric is the negative remanent polarization, a potential change does not occur.

Note that in the above-described example, it is assumed that re-erasing is performed at the time of reading in a case where the remanent polarization is positive. However, re-erasing may not be performed at the time of reading. In a case where restoration to the original state is required, the original state can be restored by performing the above-described erase drive control at another timing after reading.

As described above, according to the fifth embodiment of the present technology, in a case where the N-type transistor 120 of the third embodiment is replaced with the P-type transistor 150, the voltage between the top electrode 112 and the bottom electrode 113 required at the times of writing and reading can also be reduced.

Note that the above-described embodiments show an example for embodying the present technology, and matters in the embodiments and matters specifying the invention in the claims have one-to-one correspondence relationships. Likewise, matters specifying the invention in the claims and matters to which the same names as these are assigned in the embodiments of the present technology have one-to-one correspondence relationships. However, the present technology is not limited to the embodiments and can be embodied by making various modifications to the embodiments without departing from the scope thereof.

Note that the effects described in the present description are merely examples and non-limiting, and other effects may be included.

Note that the present technology can also have the following configurations.

(1) A ferroelectric memory including:
a ferroelectric capacitor including a ferroelectric film above and below which a top electrode and a bottom electrode including materials with different work functions are formed;
a transistor connected to either the top electrode or the bottom electrode to select the ferroelectric capacitor; and
a drive control unit that applies, at the times of writing and reading, a voltage lower than that at the time of erasing by a predetermined potential difference to the ferroelectric film.

(2) The ferroelectric memory according to (1) above, in which
the predetermined potential difference is a voltage depending on the work functions of the materials of the top electrode and the bottom electrode.

(3) The ferroelectric memory according to (1) or (2) above, in which
the predetermined potential difference is a voltage corresponding to an absolute value of a difference between the work functions of the materials of the top electrode and the bottom electrode.

(4) The ferroelectric memory according to any one of (1) to (3) above, in which
the drive control unit applies, at the time of erasing, a voltage with a longer pulse width than at the time of writing to the ferroelectric film.

(5) The ferroelectric memory according any one of (1) to (4) above, in which
the drive control unit performs, at the time of reading, rewriting by applying a voltage with a pulse width and a voltage value equivalent to those at the time of erasing to the ferroelectric film.

(6) The ferroelectric memory according to any one of (1) to (5) above, in which
the transistor is an N-type transistor, and
one of the top electrode and the bottom electrode to which a voltage of a higher absolute value is applied at the time of writing or reading includes a material with a lower work function than the other.

(7) The ferroelectric memory according to (6) above, further including a contact that connects one of the top electrode and the bottom electrode to which the voltage of the higher absolute value is applied at the time of writing or reading and the transistor.

(8) The ferroelectric memory according to (7) above, in which
the bottom electrode is connected to the transistor via the contact, and includes a material with a higher work function than the top electrode.

(9) The ferroelectric memory according to (7) above, in which
the top electrode is connected to the transistor via the contact, and includes a material with a higher work function than the bottom electrode.

(10) The ferroelectric memory according to any one of (1) to (9) above, in which
the transistor is a P-type transistor, and
one of the top electrode and the bottom electrode to which a voltage of a higher absolute value is applied at the time of writing or reading includes a material with a higher work function than the other.

(11) The ferroelectric memory according to any one of (1) to (10) above, further including a sense amplifier that amplifies a potential of the ferroelectric capacitor selected by the transistor.

(12) The ferroelectric memory according to any one of (1) to (11) above, in which
the ferroelectric film includes a material with an electronegativity of a metal atom of less than 1.7.

(13) The ferroelectric memory according to any one of (1) to (12) above, in which
the ferroelectric film includes a hafnium oxide film.

(14) A ferroelectric memory element including:
a ferroelectric film including a hafnium oxide film;
a top electrode and a bottom electrode formed above and below the ferroelectric film, the top electrode and the bottom electrode including materials with different work functions; and
a transistor connected to one of the top electrode and the bottom electrode via a contact.

REFERENCE SIGNS LIST

110 Ferroelectric capacitor
111 Ferroelectric film
112 Top electrode
113 Bottom electrode
114 Contact
120 N-type transistor
121 Gate electrode
122 Source region
123 Drain region
131 Plate line
132 Word line
133 Bit line
140 Sense amplifier
150 P-type transistor
190 Drive control unit

What is claimed is:
1. A ferroelectric memory, comprising:
a ferroelectric capacitor including a ferroelectric film above and below which a top electrode and a bottom electrode including materials with different work functions are disposed;
a transistor connected to either the top electrode or the bottom electrode to select the ferroelectric capacitor; and
a drive control unit that applies, at times of writing and reading, a voltage lower than that applied at a time of erasing by a predetermined potential difference to the ferroelectric film.

2. The ferroelectric memory according to claim 1, wherein
the predetermined potential difference is a voltage depending on the work functions of the materials of the top electrode and the bottom electrode.

3. The ferroelectric memory according to claim 1, wherein
the predetermined potential difference is a voltage corresponding to an absolute value of a difference between the work functions of the materials of the top electrode and the bottom electrode.

4. The ferroelectric memory according to claim 1, wherein
the drive control unit applies, at the time of erasing, a voltage with a longer pulse width than at the time of writing to the ferroelectric film.

5. The ferroelectric memory according to claim 1, wherein
the drive control unit performs, at the time of reading, rewriting by applying a voltage with a pulse width and a voltage value equivalent to those at the time of erasing to the ferroelectric film.

6. The ferroelectric memory according to claim 1, wherein
the transistor is an N-type transistor, and
one of the top electrode and the bottom electrode to which a voltage of a higher absolute value is applied at the time of writing or reading includes a material with a lower work function than the other.

7. The ferroelectric memory according to claim 6, further comprising a contact that connects one of the top electrode and the bottom electrode to which the voltage of the higher absolute value is applied at the time of writing or reading and the transistor.

8. The ferroelectric memory according to claim 7, wherein
the bottom electrode is connected to the transistor via the contact, and includes a material with a higher work function than the top electrode.

9. The ferroelectric memory according to claim 7, wherein
the top electrode is connected to the transistor via the contact, and includes a material with a higher work function than the bottom electrode.

10. The ferroelectric memory according to claim 1, wherein
the transistor is a P-type transistor, and
one of the top electrode and the bottom electrode to which a voltage of a higher absolute value is applied at the time of writing or reading includes a material with a higher work function than the other.

11. The ferroelectric memory according to claim 1, further comprising a sense amplifier that amplifies a potential of the ferroelectric capacitor selected by the transistor.

12. The ferroelectric memory according to claim 1, wherein
the ferroelectric film includes a material with an electronegativity of a metal atom of less than 1.7.

13. The ferroelectric memory according to claim 1, wherein
the ferroelectric film includes a hafnium oxide film.

14. A ferroelectric memory element comprising:
a ferroelectric film including a hafnium oxide film;
a top electrode and a bottom electrode, wherein the top electrode is on a first side of the ferroelectric film, wherein the bottom electrode is on a second side of the ferroelectric film, and wherein the top electrode and the bottom electrode include materials having different work functions;
a transistor connected to one of the top electrode and the bottom electrode via a contact; and
a drive control unit that applies, at times of writing and reading, a voltage lower than that applied at a time of erasing by a predetermined potential difference to the ferroelectric film.

* * * * *